United States Patent
Likhanskii et al.

(10) Patent No.: US 11,011,343 B2
(45) Date of Patent: May 18, 2021

(54) HIGH-CURRENT ION IMPLANTER AND METHOD FOR CONTROLLING ION BEAM USING HIGH-CURRENT ION IMPLANTER

(71) Applicant: APPLIED Materials, Inc., Santa Clara, CA (US)

(72) Inventors: Alexandre Likhanskii, Malden, MA (US); Shengwu Chang, South Hamilton, MA (US); Frank Sinclair, Boston, MA (US); Antonella Cucchetti, Gloucester, MA (US); Eric D Hermanson, Georgetown, MA (US); Christopher Campbell, Newburyport, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 16/542,731

(22) Filed: Aug. 16, 2019

(65) Prior Publication Data

US 2021/0020399 A1    Jan. 21, 2021

Related U.S. Application Data

(60) Provisional application No. 62/874,192, filed on Jul. 15, 2019.

(51) Int. Cl.
*H01J 37/12*    (2006.01)
*H01J 37/317*   (2006.01)
*H01J 37/05*    (2006.01)

(52) U.S. Cl.
CPC .............. *H01J 37/12* (2013.01); *H01J 37/05* (2013.01); *H01J 37/3171* (2013.01);
(Continued)

(58) Field of Classification Search
USPC ...................................................... 250/396 R
See application file for complete search history.

(56) References Cited

U.S. PATENT DOCUMENTS

| | | | | |
|---|---|---|---|---|
| 4,758,723 A | * | 7/1988 | Wardell | H01J 49/46 250/305 |
| 6,998,625 B1 | * | 2/2006 | McKenna | H01J 37/3171 250/492.2 |

(Continued)

FOREIGN PATENT DOCUMENTS

| | | |
|---|---|---|
| CN | 101467217 A | 6/2009 |
| JP | 2018-174016 A | 11/2018 |
| KR | 1020120116451 A | 10/2012 |

OTHER PUBLICATIONS

International Search Report dated Oct. 13, 2020, for the International Patent Application No. PCT/US2020/039159, filed on Jun. 23, 2020, 4 pages.

(Continued)

*Primary Examiner* — Phillip A Johnston
(74) *Attorney, Agent, or Firm* — Kacvinsky Daisak Bluni PLLC

(57) ABSTRACT

Provided herein are approaches for increasing operational range of an electrostatic lens. An electrostatic lens of an ion implantation system may receive an ion beam from an ion source, the electrostatic lens including a first plurality of conductive beam optics disposed along one side of an ion beam line and a second plurality of conductive beam optics disposed along a second side of the ion beam line. The ion implantation system may further include a power supply in communication with the electrostatic lens, the power supply operable to supply a voltage and a current to at least one of the first and second plurality of conductive beam optics, wherein the voltage and the current deflects the ion beam at a beam deflection angle, and wherein the ion beam is accelerated and then decelerated within the electrostatic lens.

20 Claims, 5 Drawing Sheets

(52) U.S. Cl.
CPC ............... *H01J 2237/04735* (2013.01); *H01J 2237/04756* (2013.01); *H01J 2237/057* (2013.01); *H01J 2237/12* (2013.01); *H01J 2237/151* (2013.01); *H01J 2237/24585* (2013.01)

(56) References Cited

U.S. PATENT DOCUMENTS

| | | | |
|---|---|---|---|
| 7,339,179 B2* | 3/2008 | Radovanov | H01J 37/12 250/396 R |
| 7,675,031 B2* | 3/2010 | Konicek | H01J 49/4225 250/286 |
| 7,888,653 B2 | 2/2011 | Kellerman et al. | |
| 9,721,750 B2* | 8/2017 | Lee | H01J 37/3171 |
| 10,614,992 B2* | 4/2020 | Matsui | G01N 23/227 |
| 2009/0206270 A1 | 8/2009 | Glayish et al. | |
| 2011/0155921 A1* | 6/2011 | Kellerman | H01J 37/3171 250/396 R |
| 2012/0168637 A1 | 7/2012 | Kellerman et al. | |
| 2017/0169987 A1 | 6/2017 | Lee et al. | |
| 2018/0233320 A1 | 8/2018 | Ikegami et al. | |

OTHER PUBLICATIONS

Written Opinion dated Oct. 13, 2020, for the International Patent Application No. PCT/US2020/039159, filed on Jun. 23, 2020, 5 pages.

* cited by examiner

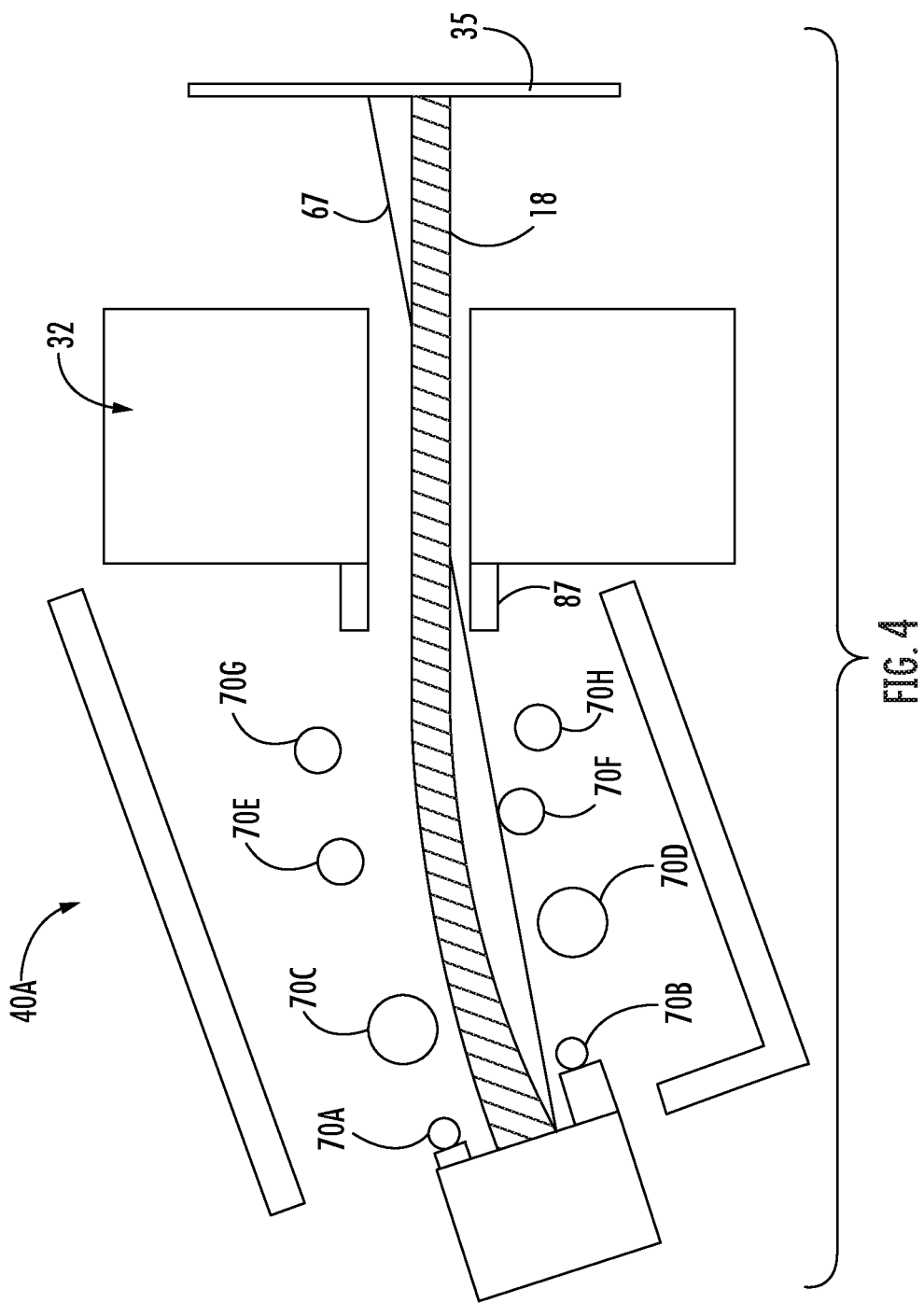

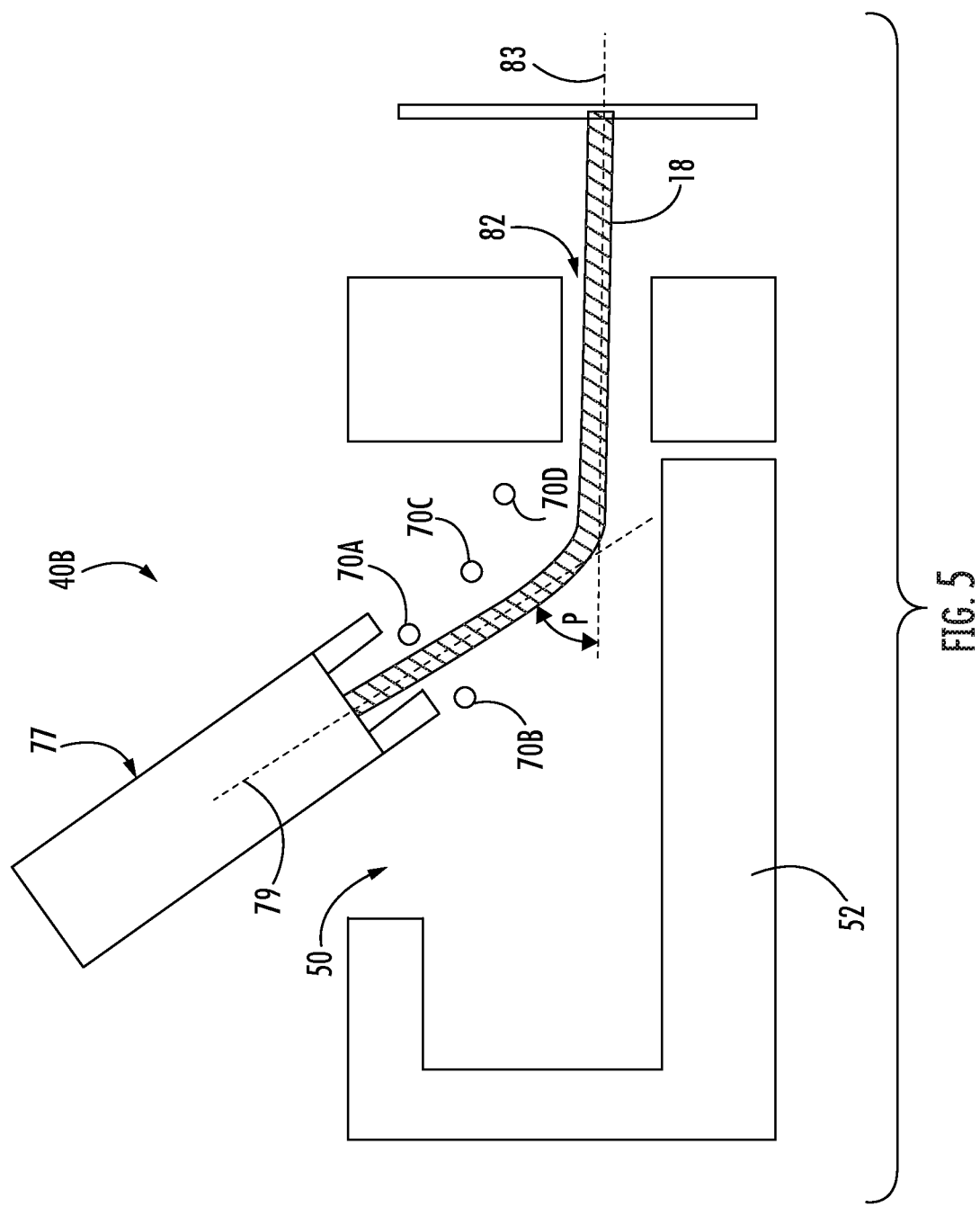

HIGH-CURRENT ION IMPLANTER AND METHOD FOR CONTROLLING ION BEAM USING HIGH-CURRENT ION IMPLANTER

CROSS-REFERENCE TO RELATED APPLICATION

This is a non-provisional application of pending U.S. provisional patent application Ser. No. 62/874,192, filed Jul. 15, 2019, the entirety of which application is incorporated by reference herein.

FIELD OF THE DISCLOSURE

The disclosure relates generally to semiconductor processing and, more particularly, to high-current ion implanters.

BACKGROUND OF THE DISCLOSURE

Ion implantation systems may include an ion source and a series of beam-line components. The ion source may comprise a chamber where ions are generated. The ion source may also comprise a power source and an extraction electrode assembly disposed near the chamber. The beam-line components may include, for example, a mass analyzer, a first acceleration or deceleration stage, a collimator, and a second acceleration or deceleration stage. Similar to a series of optical lenses for manipulating a light beam, the beam-line components can filter, focus, and manipulate ions or an ion beam to have an intended species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

Ion implantation systems operating at a high current typically operate in drift or drift/deceleration modes. In these modes, the ion beam extracted from the source is transported along the beamline at a fixed energy and may potentially be decelerated to the final energy at a later stage. However, this design imposes certain restrictions on beamline operation. For example, mass analyzing magnets are typically designed to transport a certain maximum mass energy product. Electrical isolation and power supplies are also limited to hold certain voltages.

It is therefore beneficial to develop an approach, which would allow operation of high current implanter both with all conventional benefits and extended maximum energy.

SUMMARY OF THE DISCLOSURE

In one approach, an ion implantation system may include an electrostatic lens receiving an ion beam, the electrostatic lens including a first plurality of conductive beam optics disposed along one side of an ion beam line and a second plurality of conductive beam optics disposed along a second side of the ion beam line. The ion implantation system may further include a power supply in communication with the electrostatic lens, the power supply operable to supply a voltage and a current to at least one of the first and second plurality of conductive beam optics, wherein the voltage and the current deflects the ion beam at a beam deflection angle, and wherein the ion beam is accelerated and then decelerated within the electrostatic lens.

In another approach, a lens may include a chamber wall defining a chamber, and a first plurality of electrodes and a second plurality of electrodes within the chamber. The electrostatic lens may receive an ion beam from an ion source, wherein the first plurality of electrodes is disposed along one side of an ion beam line, wherein the second plurality of electrodes is disposed along a second side of the ion beam line, wherein a voltage and a current is supplied to at least one of the first and second plurality of electrodes to deflect the ion beam at a beam deflection angle, and wherein the ion beam is accelerated and then decelerated as the ion beam passes through the chamber.

In yet another approach, an ion implantation system may include an electrostatic lens receiving an ion beam, the electrostatic lens including a first plurality of conductive beam optics disposed along one side of an ion beam line and a second plurality of conductive beam optics disposed along a second side of the ion beam line. The ion implantation system may further include a power supply in communication with the electrostatic lens, the power supply operable to supply a voltage and a current to at least one of the first and second plurality of conductive beam optics, wherein the voltage and the current deflects the ion beam at a beam deflection angle, and wherein the voltage and the current to the at least one of the first and second plurality of conductive beam optics causes the ion beam to accelerate and then decelerate within the electrostatic lens.

BRIEF DESCRIPTION OF THE DRAWINGS

FIG. 4 a side cross-sectional view of an electrostatic filter in accordance with embodiments of the present disclosure.

FIG. 5 a side cross-sectional view of an electrostatic filter in accordance with embodiments of the present disclosure.

Figure 1:
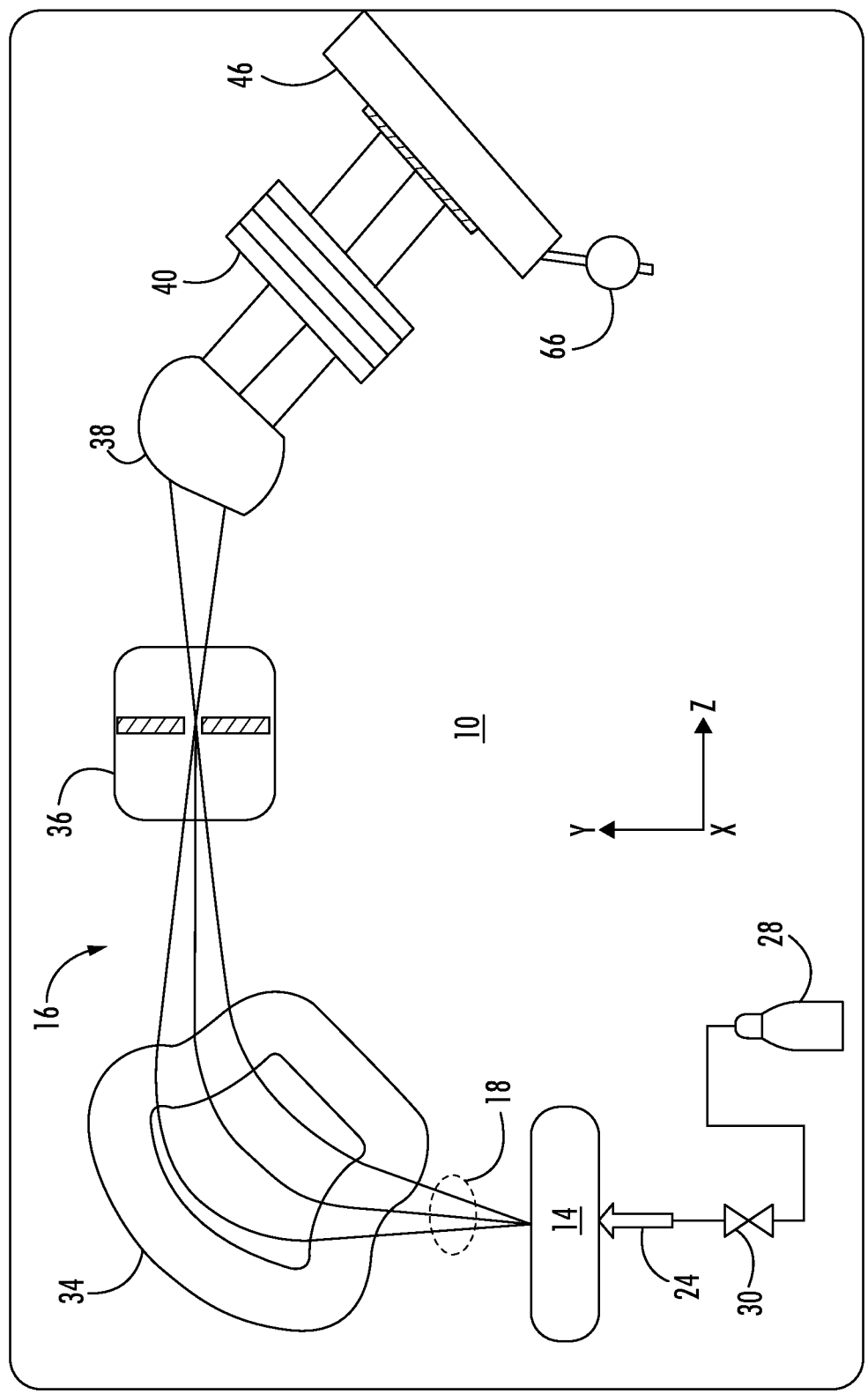
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An ion implantation system, electrostatic filter or lens, and method in accordance with the present disclosure will now be described more fully hereinafter with reference to the accompanying drawings, where embodiments of the disclosure are shown. The ion implantation system, electrostatic filter, and method may be embodied in many different forms and are not be construed as being limited to the embodiments set forth herein. Instead, these embodiments are provided so this disclosure will be thorough and complete, and will fully convey the scope of the system and method to those skilled in the art.

In view of the foregoing deficiencies identified with the prior art, provided herein are ion implantation systems, electrostatic filters, and methods, which allow operation of a high-current implanter both with all conventional benefits and extended maximum energy to cover part of the medium energy implanter operational space. An exemplary electrostatic lens of an ion implantation system may receive an ion beam from a beamline component, the electrostatic lens including a first plurality of conductive beam optics disposed along one side of an ion beam line and a second plurality of conductive beam optics disposed along a second side of the ion beam line. The ion implantation system may further include a power supply in communication with the electrostatic lens, the power supply operable to supply a voltage and a current to at least one of the first and second plurality of conductive beam optics, wherein the voltage and the current deflects the ion beam at a beam deflection angle, and wherein the ion beam is accelerated and then decelerated as the ion beam passes through the electrostatic lens.

Referring now to FIG. 1, an exemplary system in accordance with the present disclosure is shown. The ion implantation system (hereinafter "system") 10 represents a process chamber containing, among other components, an ion source 14 for producing an ion beam 18, an ion implanter, and a series of beam-line components 16. The ion source 14 may comprise a chamber for receiving a flow of gas 24 and generating ions therein. The ion source 14 may also comprise a power source and an extraction electrode assembly disposed near the chamber. The beam-line components 16 may include, for example, a mass analyzer 34, a first acceleration or deceleration stage 36, a collimator 38, and an electrostatic filter (EF) 40, which may correspond to an acceleration and deceleration stage. Although not shown, the beam-line components 16 may further include a plasma flood gun (PFG) downstream of the EF 40.

In exemplary embodiments, the beam-line components 16 may filter, focus, and manipulate ions or the ion beam 18 to have a desired species, shape, energy, and other qualities. The ion beam 18 passing through the beam-line components 16 may be directed toward a substrate mounted on a platen or clamp within a process chamber 46. As appreciated, the substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The EF 40 may be configured to independently control deflection, acceleration, deceleration, and focus of the ion beam 18. In one embodiment, the EF 40 is a vertical electrostatic energy filter (VEEF). As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam 18 at each point along the central ion beam trajectory for independently controlling deflection, acceleration, deceleration, and/or focus of the ion beam 18.

Although non-limiting, the ion source 14 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 14 may generate the ion beam 18 for processing a substrate. In various embodiments, the ion beam (in cross-section) may have a targeted shape, such as a spot beam or ribbon beam, as known in the art. In the Cartesian coordinate system shown, the direction of propagation of the ion beam 18 may be represented as parallel to the Z-axis, while the actual trajectories of ions with the ion beam 18 may vary. In order to process the substrate, the ion beam 18 may be accelerated to acquire a target energy by establishing a voltage (potential) difference between the ion source 14 and the wafer. For example, the ion source 14 may be coupled to a targeted voltage (VT), e.g., +120 kV, where VT is supplied by a voltage supply, and is designed to generate a targeted ion energy for ions during processing of the wafer.

More specifically, the ion source 14 may be biased at a +120 kV potential, while beamline components 16, such as the mass analyzer 34, the first acceleration or deceleration stage 36, and the collimator 38 may be biased at +60 kV. The voltage potential decreases from +60 kV to 0 kV across the EF 40. More specifically, in some embodiments, the voltage potential may first decrease from +60 kV to approximately −20 kV within the EF 40, before increasing to 0 kV when exiting the EF 40. Finally, the wafer may be at 0V potential in this example. As demonstrated, beam transport limits, such as energy of the ion beam 18 in the mass analyzer 34, are not changed, as compared to conventional beamline operation, and all potential drops across different parts of the system 10 also remain unchanged. Furthermore, all power supplies remain unchanged. However, the operational space is increase from conventional 60 kV to potentially 120 kV beams.

Figure 2:
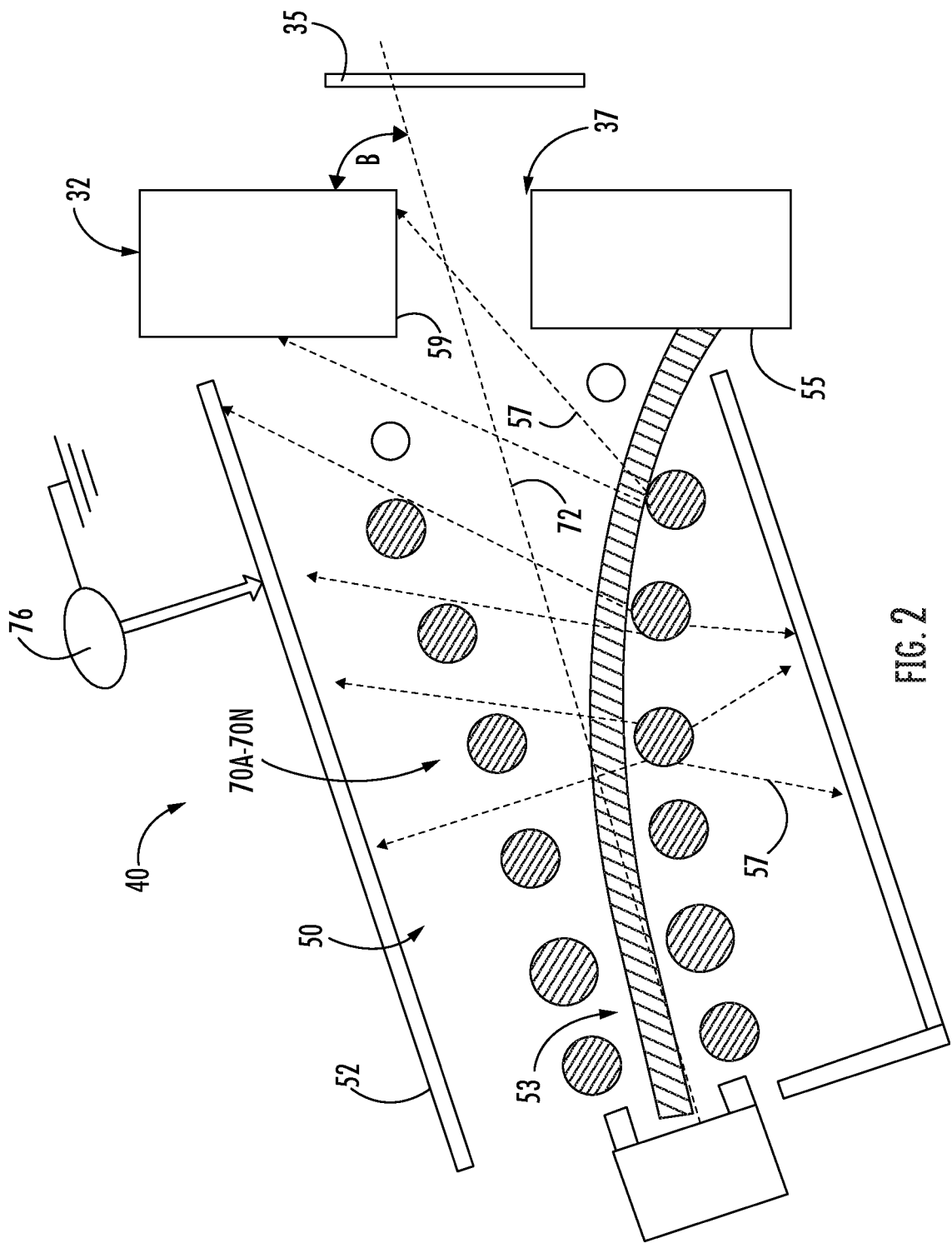
FIG. 2 a side cross-sectional view of an electrostatic filter of the ion implantation system shown in FIG. 1 in accordance with embodiments of the present disclosure.

Referring now to FIG. 2, the EF 40 according to exemplary embodiments will be described in greater detail. As shown, the EF 40 includes an EF chamber 50 defined by a chamber housing 52. The EF 40 may further operate with one or more vacuum pumps (not shown) to adjust a pressure of the EF chamber 50. The EF 40 may be bordered along one end by a PFG 32, which has an opening 37 to permit the ion beam (not shown) to pass therethrough to the wafer 35. As shown, the PFG 32 is between the EF 40 and the wafer 35, and the PFG 32 and the wafer 35 are oriented at an angle β relative to an ion beam-line/trajectory 72. Although non-limiting, the angle β may be between 5-30°. Due to the arrangement of a plurality of conductive beam optics 70A-70N within the EF chamber 50, and due to the orientation of the EF 40 relative to the PFG 32 and the wafer 35, the EF 40 is considered "curved" or asymmetrical.

As shown, the EF 40 may include one or more conductive beam optics 70A-70N, which may be a plurality of graphite electrode rods disposed along the ion beam-line/trajectory 72. In this embodiment, the conductive beam optics 70A-70N are arranged in an asymmetrical configuration with respect to the ion beam line/trajectory 72. Although non-limiting, the plurality of conductive beam optics 70A-70N may include a set of entrance electrodes, a set of exit electrodes, and one or more sets of suppression/focusing electrodes. As shown, each set of electrode pairs provides a space/opening to allow the ion beam (e.g., a ribbon beam) to pass therethrough.

In exemplary embodiments, the conductive beam optics 70A-70N include pairs of conductive pieces electrically coupled to one another. Alternatively, the conductive beam optics 70A-70N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the conductive beam optics 70A-70N are depicted as seven (7) pairs (e.g., with five (5) sets of suppression/focusing electrodes), a different number of elements (or electrodes) may be utilized. For example, the configuration of conductive beam optics 70A-70N may utilize a range of three (3) to ten (10) electrode sets.

In some embodiments, the ion beam passing through the electrodes along the ion beam-line 72 may include boron or other elements. Electrostatic focusing of the ion beam may be achieved by using several thin electrodes (e.g., the suppression/focusing electrodes) to control grading of potential along the ion beam-line 72. In the configuration of conductive beam optics 70A-70N shown, the ion beam may be accelerated as it travels towards the PFG 32 and the wafer 35, and deflected by approximately 15°.

In some embodiments, a power supply 76 (e.g., a DC power supply) supplies a voltage and a current to the EF 40. The voltage/current may be supplied to conductive beam optics 70A-70N to generate a plasma within the EF chamber 50. In various embodiments, the voltage and current provided by the power supply 76 may be constant or varied. In one embodiment, the conductive beam optics 70A-70N are held at a series of DC potentials from 0.1 keV-100 keV. The conductive beam optics 70A-70N may be electrically driven in parallel (e.g., individually) or in series to enable uniform and/or independent operation of each of the conductive beam optics 70A-70N.

In addition to extending the operation of conventional implanters to higher energies, curved final acceleration provided by the EF 40 has additional benefits. For example, particles 53, generated along the ion beam-line/trajectory 72 prior to entering the EF 40, cannot propagate to the wafer 35. If the particles 53 are neutral, the particles 53 will be filtered by the curvature of the EF 40. If the particles 53 are negatively charged, the particles 53 will be deflected back to the ion beam-line/trajectory 72 by an electrostatic field within the EF chamber 50. Meanwhile, if the particles 53 are positively charged, they will be bent down to those conductive beam optics below the ion beam-line/trajectory 72. As demonstrated, the positively charged particles 53 do not exit through the opening 37 of the PFG 32. Instead, the positively charged particles 53 may impact a front face 55 of the PFG 32. In addition, positively or negatively charged particles 57 generated at one or more of the conductive beam optics 70A-70N of the EF 40 will not reach the wafer 35. Instead, the particles 57 may generally impact an interior of the chamber housing 52, the front face 55 of the PFG 32, and a portion of a sidewall 59 defining the exit 37 of the PFG 32.

Figure 3:
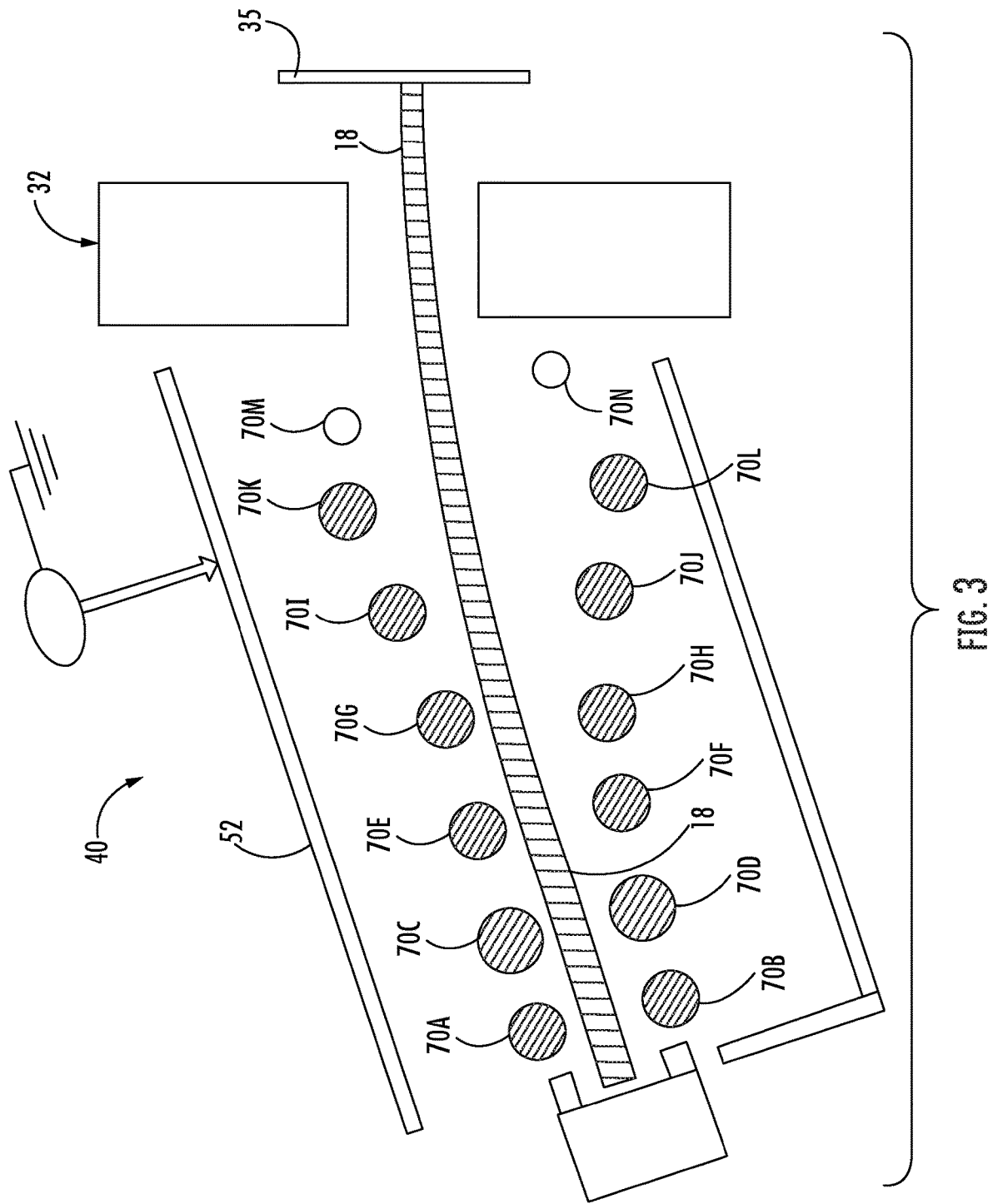
FIG. 3 a side cross-sectional view of an electrostatic filter in accordance with embodiments of the present disclosure.

FIG. 3 demonstrates an ion beam 18 in the EF 40. In this embodiment, all of the top conductive beam optics, e.g., 70A, 70C, 70E, 70G, 70I, 70K, and 70M may be grounded (0 kV), while all of the bottom conductive beam optics 70B, 70D, 70F, 70H, 70J, 70L, and 70N may be powered. In various embodiments, conductive beam optic 70A may be at terminal potential or grounded. Although non-limiting, the ion beam 18 may be a phosphorous (P+) 80 kV beam, conductive beam optic 70A may have a potential of +30 kV, and conductive beam optics 70H, 70J, and 70L may be have a potential of −40 kV.

In some embodiments, the EF 40 may not contain any suppression electrodes, typically required for decelerating lenses. This is possible because the ion beam 18 is at a more positive potential compared to any of the conductive beam optics 70A-N and the chamber wall 52. Keeping all of the top conductive beam optics, e.g., 70A, 70C, 70E, 70G, 70I, 70K, and 70M at grounded potential enables extremely low electrostatic stresses and eliminates or reduces glitching.

During use, the ion beam 18 may initially be at +60 kV when entering the EF 40. However, in various other embodiments, the ion beam may initially be between +20 kV and 85 kV. At this stage, the ion beam 18 is accelerating through the EF 40, for example, as the ion beam passes conductive beam optics 70A-70D. At conductive beam optics 70C-70F, the ion beam 18 may be at approximately +10 kV, and at conductive beam optics 70G-70J, the ion beam may be at approximately −20 kV. As the ion beam 18 passes conductive beam optics 70K-70N, the ion beam 18 decelerates towards the PFG 32. The ion beam 18 and the PFG 32 may be 0 kV as the ion beam exits the EF 40.

In some embodiments, as demonstrated in the EF 40A of FIG. 4, bottom conductive beam optics 70B, 70D, 70F, and 70H can be shielded from a line of sight 67 deposition of sputter material from the wafer 35, keeping the bottom conductive beam optics 70B, 70D, 70F, and 70H cleaner. Although non-limiting, the line of sight 67 may be defined by conductive beam optic 70F, as well as a block feature 87 of the PFG 32. Such configuration will eliminate or at least reduced the source of particles, which could be potentially generated at the bottom conductive beam optics 70B, 70D, 70F, and 70H, and may eliminate or at least reduce triggering mechanisms for material flaking for the top conductive beam optics 70A, 70C, 70E, 70G.

As demonstrated in FIG. 5, the curved acceleration/deceleration design of the electrostatic filters described herein also enables high energy operation of the ion implanter with no contamination on either the electrodes and/or any powered surface. For example, an EF 40B may be a high bend angle lens characterized by an entrance tunnel 77 having an entrance axis 79 extending into the EF chamber 50, which is defined by the chamber wall 52. The EF 40B may further include an exit tunnel 82, which is connected to the EF chamber 40B and defines an exit axis 83. As shown, the entrance axis 79 and the exit axis 82 may define a beam deflection angle ρ, which may be at least 30 degrees in some embodiments.

A plurality of electrodes 70A-70D may define a beam path, for example, an average direction of propagation of the ion beam 18, or a position of the central ray trajectory of the ion beam 18. In operation, a determined set of voltages may be applied to the different electrodes 70A-70D, to accelerate, deflect, and focus the ion beam in a manner causing the ion beam to follow the beam path, which generally follows the entrance axis 79 and the exit axis 82. As such, one electrode, e.g., the electrode 70B, is disposed on a first side of the ion beam 18, meaning to the left and below the ion beam 18. The other electrodes, such as at least three electrodes, may be disposed on a second side of the ion beam 18, meaning above and to the right of the beam path. As represented by FIG. 5, in some embodiments, just electrode 70B may be disposed on the first side of the beam path, in an asymmetric configuration, and at least three electrodes, i.e., 70A, 70C, and 70D, are disposed on the second side. However, embodiments herein are not limited in this context.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

In accordance with embodiments of the disclosure, the terms "more positive" or "less positive," "greater" or "less," as used herein with respect to voltages (potentials) may refer to a relative voltage of two different entities. Accordingly, 0V is "greater" or "more positive" than −5 kV, while +10 kV is "greater" or more positive than 0V, for example. Moreover, −10 kV is "less positive" than −5 kV. The terms "less negative" negative or "more negative" may also refer to a relative voltage. For example, 0 kV may be referred to as more negative than +5 kV, while +10 kV is less negative than +5 kV.

In view of the foregoing, at least the following advantages are achieved by the embodiments disclosed herein. The present embodiments provide a first advantage in that direct contamination of a substrate from an electrostatic filter is reduced by eliminating the ability for negatively charged particles generated the filter electrodes from striking the substrate. In addition, another advantage provided by the present embodiments is the elimination of indirect substrate contamination resulting from accumulation of resputtered material from the substrate on electrodes of the electrostatic filter, resulting in an additional contamination source do to subsequent sputtering or flaking from the electrodes.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. An ion implantation system, comprising:
an electrostatic lens receiving an ion beam, the electrostatic lens including a first plurality of conductive beam optics disposed along one side of an ion beam line and a second plurality of conductive beam optics disposed along a second side of the ion beam line; and
a power supply in communication with the electrostatic lens, the power supply operable to supply a voltage and a current to at least one of the first and second plurality of conductive beam optics, wherein the voltage and the current deflects the ion beam at a beam deflection angle, and wherein the ion beam is accelerated and then decelerated within the electrostatic lens by modifying a voltage potential of the ion beam from a positive voltage potential at an entrance of the electrostatic lens, to a negative voltage potential within the electrostatic lens, and then to zero potential at an exit of the electrostatic lens.

2. The ion implantation system of claim 1, further comprising a plasma flood gun positioned between the electrostatic lens and a wafer, wherein the plasma flood gun and the wafer are oriented at an angle relative to the ion beam line.

3. The ion implantation system of claim 2, wherein the wafer is grounded, and wherein a mass analyzer and a collimator along the ion beam line are at the positive voltage potential.

4. The ion implantation system of claim 3, wherein the positive voltage potential is greater than or equal to a potential of the first and second plurality of conductive beam optics.

5. The ion implantation system of claim 1, wherein the positive voltage potential is greater than a potential of a chamber wall surrounding the first and second plurality of conductive beam optics.

6. The ion implantation system of claim 1, wherein the ion beam enters the electrostatic lens at a beam potential greater than 0 kV.

7. The ion implantation system of claim 1, wherein the first plurality of conductive beam optics is grounded.

8. The ion implantation system of claim 7, wherein the voltage and the current are delivered only to the second plurality of conductive beam optics.

9. The ion implantation system of claim 1, wherein the first and second plurality of conductive beam optics are devoid of any suppression electrodes.

10. The ion implantation system of claim 1, wherein the first plurality of conductive beam optics is arranged in an asymmetric configuration relative to the second plurality of conductive beam optics.

11. The ion implantation system of claim 1, further comprising:
an entrance tunnel, the entrance tunnel having an entrance axis extending into a chamber defined by a chamber wall; and
an exit tunnel, connected to the chamber and defining an exit axis, wherein the entrance axis and the exit axis define the beam deflection angle, the beam deflection angle being at least 30 degrees therebetween.

12. A lens, comprising:
a chamber wall defining a chamber; and
a first plurality of electrodes and a second plurality of electrodes within the chamber, the chamber receiving an ion beam from an ion source, wherein the first plurality of electrodes is disposed along one side of an ion beam line, wherein the second plurality of electrodes is disposed along a second side of the ion beam line, wherein a voltage and a current is supplied to at least one of the first and second plurality of electrodes to deflect the ion beam at a beam deflection angle, and wherein the ion beam is accelerated and then decelerated as the ion beam passes through the chamber by modifying a voltage potential of the ion beam from a positive voltage potential at an entrance of the chamber, to a negative voltage potential within the chamber, and then to zero potential at an exit of the chamber.

13. The lens of claim 12, wherein the ion beam is delivered to a wafer, wherein the wafer is grounded, wherein a mass analyzer and a collimator along the ion beam line are at the positive potential, and wherein the positive potential is greater than or equal to a potential of the first and second plurality of electrodes.

14. The lens of claim 12, wherein the positive voltage potential is greater than a potential of the chamber wall.

15. The lens of claim 12, wherein the ion beam enters the chamber at a beam potential between 20 kV and 85 kV.

16. The lens of claim 12, wherein the first plurality of electrodes is grounded.

17. The lens of claim 16, wherein the voltage and current are delivered only to the second plurality of electrodes.

18. The lens of claim 12, wherein the first and second plurality of electrodes are devoid of any suppression electrodes, and wherein the first plurality of electrodes is arranged in an asymmetric configuration relative to the second plurality of electrodes.

19. The lens of claim 12, further comprising:
an entrance tunnel, the entrance tunnel having an entrance axis extending into the chamber, wherein the chamber is defined by a chamber wall; and
an exit tunnel, connected to the chamber and defining an exit axis, wherein the entrance axis and the exit axis define the beam deflection angle, the beam deflection angle being at least 30 degrees therebetween.

20. An ion implantation system, comprising:
an electrostatic lens receiving an ion beam, the electrostatic lens including a first plurality of conductive beam optics disposed along one side of an ion beam line and a second plurality of conductive beam optics disposed along a second side of the ion beam line; and
a power supply in communication with the electrostatic lens, the power supply operable to supply a voltage and a current to at least one of the first and second plurality of conductive beam optics, wherein the voltage and the current deflects the ion beam at a beam deflection angle, and wherein the voltage and the current to the at least one of the first and second plurality of conductive beam optics causes the ion beam to accelerate and then decelerate within the electrostatic lens by modifying a voltage potential of the ion beam from a positive voltage potential at an entrance of the electrostatic lens, to a negative voltage potential within the electrostatic lens, and then to zero potential at an exit of the electrostatic lens.

* * * * *